United States Patent
Kao et al.

(10) Patent No.: US 9,514,953 B2
(45) Date of Patent: Dec. 6, 2016

(54) METHODS FOR BARRIER LAYER REMOVAL

(71) Applicant: Applied Materials, Inc., Santa Clara, CA (US)

(72) Inventors: Chia-Ling Kao, San Jose, CA (US); Sean Kang, San Ramon, CA (US); Jeremiah T. Pender, San Jose, CA (US); Srinivas D. Nemani, Sunnyvale, CA (US); He Ren, San Jose, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 82 days.

(21) Appl. No.: 14/541,978

(22) Filed: Nov. 14, 2014

(65) Prior Publication Data
US 2015/0140827 A1 May 21, 2015

Related U.S. Application Data (60) Provisional application No. 61/906,790, filed on Nov. 20, 2013, provisional application No. 61/917,236, filed on Dec. 17, 2013.

(51) Int. Cl.
| | |
|---|---|
| H01L 21/302 | (2006.01) |
| H01L 21/461 | (2006.01) |
| H01L 21/311 | (2006.01) |
| H01L 21/02 | (2006.01) |
| H01J 37/32 | (2006.01) |
| H01L 21/768 | (2006.01) |

(52) U.S. Cl.
CPC .... *H01L 21/31116* (2013.01); *H01J 37/32449* (2013.01); *H01J 37/32477* (2013.01); *H01J 37/32834* (2013.01); *H01J 37/32871* (2013.01); *H01L 21/02063* (2013.01); *H01L 21/76802* (2013.01); *H01L 21/76807* (2013.01); *H01L 21/76826* (2013.01); *H01L 21/76829* (2013.01)

(58) Field of Classification Search
CPC .................................. H01L 21/31116
USPC .......................................... 438/704
See application file for complete search history.

(56) References Cited

U.S. PATENT DOCUMENTS

| | | |
|---|---|---|
| 2007/0026665 A1 | 2/2007 | Bera et al. |
| 2008/0020570 A1 | 1/2008 | Naik |

(Continued)

OTHER PUBLICATIONS

Bakshi, V. and Smith, G., Patterning 180 nm Copper-Oxide Dual Damascene Baseline with 193nm Resists. Abstract for presentation at Symposium on Plasma Processing XIV; May 15, 2002; Philadelphia, PA.

*Primary Examiner* — Roberts Culbert
(74) *Attorney, Agent, or Firm* — Patterson & Sheridan, LLP (57) ABSTRACT

Implementations described herein generally relate to semiconductor manufacturing and more particularly to methods for etching a low-k dielectric barrier layer disposed on a substrate using a non-carbon based approach. In one implementation, a method for etching a barrier low-k layer is provided. The method comprises (a) exposing a surface of the low-k barrier layer to a treatment gas mixture to modify at least a portion of the low-k barrier layer and (b) chemically etching the modified portion of the low-k barrier layer by exposing the modified portion to a chemical etching gas mixture, wherein the chemical etching gas mixture includes at least an ammonium gas and a nitrogen trifluoride gas or at least a hydrogen gas and a nitrogen trifluoride gas.

20 Claims, 8 Drawing Sheets

(56) References Cited

U.S. PATENT DOCUMENTS

| | | |
|---|---|---|
| 2008/0213997 A1 | 9/2008 | Lee et al. |
| 2009/0156012 A1 | 6/2009 | Hsieh et al. |
| 2012/0252206 A1 | 10/2012 | Naik et al. |
| 2013/0105303 A1* | 5/2013 | Lubomirsky ..... H01J 37/32091 204/192.34 |
| 2013/0224960 A1 | 8/2013 | Payyapilly et al. |

* cited by examiner

METHODS FOR BARRIER LAYER REMOVAL

CROSS-REFERENCE TO RELATED APPLICATIONS

This application claims benefit of U.S. provisional patent application Ser. No. 61/906,790, filed Nov. 20, 2013 and U.S. provisional patent application Ser. No. 61/917,236, filed Dec. 17, 2013. The aforementioned related patent applications are both incorporated by reference herein in their entirety.

BACKGROUND

Field

Implementations described herein generally relate to semiconductor manufacturing and more particularly to methods for etching a low-k dielectric barrier layer disposed on a substrate using a non-carbon based approach.

Description of the Related Art

As the feature size of the device patterns get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

Fabrication techniques often now employ a mask stack that includes non-photo definable material layers disposed below a photo definable layer (i.e., a photoresist). The non-photo definable material layers may include a low-k dielectric material such as a silicon carbide based material. One example of such a silicon carbide based material is BLOk™ (barrier low-k) film, which is available from Applied Materials, Inc. of Santa Clara, Calif.

Currently, low-k barrier layers are typically etched using carbon fluoride process gases; however, these carbon fluoride-containing chemistries often form etching defects that degrade the structure. These etch-related defects commonly include faceting, micro-trenching, critical dimensions (CD) bias, micro-loading, striations, and sloped sidewalls. The terms "faceting" and "micro-trenching" are used herein to refer to the undesirable overetching of an edge of the via hole and a corner region of the trench, and the terms "critical dimensions (CD) bias" relates to a difference between critical dimensions of the opening or trench and their respective elements of the etch mask. Correspondingly, the term "micro-loading" refers to a difference in etch rates in the areas having different device density, while the terms "striations" and "sidewall slope" describe, respectively, surface roughness and vertical profiles of the opening or trench. These etch-related defects may affect performance and increase costs of devices that include such structures.

Therefore, there is a need for improved processes for etching low-k barrier layers.

SUMMARY

Implementations described herein generally relate to semiconductor manufacturing and more particularly to methods for etching a low-k dielectric barrier layer disposed on a substrate using a non-carbon based approach. In one implementation, a method for etching a barrier low-k layer is provided. The method comprises (a) exposing a surface of the low-k barrier layer to a treatment gas mixture to modify at least a portion of the low-k barrier layer and (b) chemically etching the modified portion of the low-k barrier layer by exposing the modified portion to a chemical etching gas mixture, wherein the chemical etching gas mixture includes at least an ammonium gas and a nitrogen trifluoride.

In another implementation, a method for fabricating a dual damascene structure is provided. The method comprises (a) plasma etching a via through a hardmask layer into a low-k dielectric material disposed on a substrate to expose at least a portion of a low-k barrier layer, wherein the low-k barrier layer contacts an underlying conductive material, (b) performing a wet chemical etch process to remove a residual polymer material formed during the plasma etching process, (c) exposing a surface of the exposed low-k barrier layer to a treatment gas mixture to modify at least a portion of the low-k barrier layer and (d) chemically etching the modified portion of the low-k barrier layer by exposing the modified portion to a chemical etching gas mixture, wherein the chemical etching gas mixture includes at least an ammonium gas and a nitrogen trifluoride.

In yet another implementation, a method for fabricating a dual damascene structure is provided. The method comprises (a) transferring a substrate having a silicon carbide layer disposed on a metal interconnect structure into a processing chamber, wherein the silicon carbide layer has a patterned silicon oxide layer along with a pattered mask layer disposed thereon exposing a portion of the silicon carbide layer, (b) performing a wet chemical etch process to remove a residual polymer material formed over the patterned silicon oxide layer and the patterned mask layer during a plasma etching process, (c) supplying an Ar or He gas while applying a RF bias power to modify at least a portion of the exposed silicon carbide layer, (d) supplying a chemical etching gas mixture including at least an ammonium gas and a nitrogen trifluoride while applying a RF source power remotely from the processing chamber to etch the modified silicon carbide layer and (e) supplying argon or helium gas to the processing chamber without applying RF power.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIGS. 2A-2D depict cross-sectional schematic views of a workpiece processed according to one implementation of the method of FIG. 1, whereby a low-k dielectric barrier layer positioned below a multi-layered mask is etched with a carbon-free etchant gas mixture according to implementations of the method of FIG. 1;

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein generally relate to semiconductor manufacturing and more particularly to methods for etching a low-k dielectric barrier layer disposed on a substrate using a non-carbon based process. In some implementations, a new process for dual damascene formation is provided. As process dimensions continue to shrink, new schemes of etch/clean/wiring processes are needed. In conventionally known dual damascene processes, the low-k dielectric barrier layer is opened using carbon fluoride containing chemistries, followed by a wet chemical etch process to remove polymer residual formed by the carbon fluoride chemistries. The wet chemical etch process sometimes damages underlying metal films and forms etching defects that degrade the structure. However, the gap fill process is becoming more difficult due to device scaling. Thus, a new process scheme is introduced to reduce height ratios. In the dual damascene etching processes described herein, the via stops on the low-k barrier layer. As a result, the underlying metal film (e.g., copper film) is protected by the low-k barrier layer during the wet chemical etch and metal hardmask removal processes. After the metal hardmask is removed, the low-k barrier layer is etched to expose the underlying metal film, followed by metal gap fill.

In the standard barrier etch process; carbon fluoride process gases ($CF_4$, $C_xH_yF_z$) are employed. In $C_xF_y$ based process, two main problems often occur: corner faceting and $CF_x$-based polymer remains on the surface, which drives the need for aggressive cleaning and short queue times. Implementations of the present disclosure introduce a non-carbon based approach for removal of low-k dielectric barrier layers with a soft landing on underlying metal films. First, an inert species (e.g., Ar, He, $N_2$, or $H_2$) is used to chemically or physically modify a thin layer on the plasma-treated surface. Then an ion-free downstream plasma is applied to chemically remove the modified film. This approach enables low voltage, which helps reduce corner faceting. This clean process (inert gas modification followed by clean chemical removal) is carbon-free and thus no $CF_x$-based polymer is produced on the low-k dielectric barrier layer. This lack of $CF_x$ based polymer allows for the use of less aggressive processes for low-k dielectric barrier removal, which prevents barrier undercut and corrosion of the underlying metal film and also allows for longer queue times before performing subsequent processing. To reduce low-k damage and improve throughput, high electrostatic chuck (ESC) temperature (e.g. 110° C. or greater) may be maintained through the whole etch process. The novel barrier etch processes described herein exhibit excellent profile and high barrier (e.g. BLOk)/ to low-k (e.g. Black Diamond) selectivity.

While the particular apparatus in which the implementations described herein can be practiced is not limited, it is particularly beneficial to practice the implementations in a SICONI® processing chamber sold by Applied Materials, Inc., Santa Clara, Calif. Additionally, other available etch systems may also benefit from implementations described herein.

Figure 1:
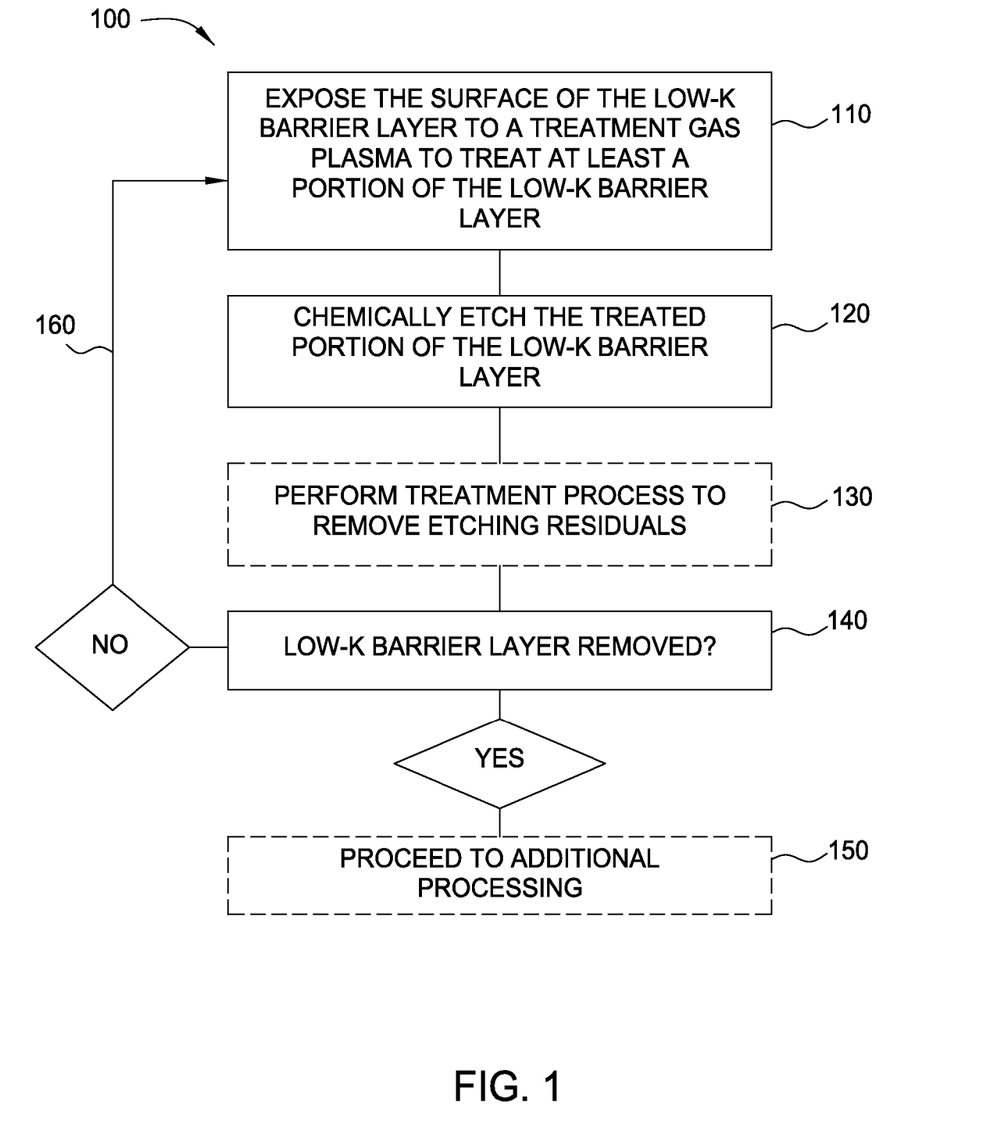
FIG. 1 is a flow chart depicting a method of etching a low-k dielectric Barrier layer positioned below a multi-layered mask where the low-k dielectric barrier layer is etched with a carbon-free etchant gas mixture according to some implementations described herein.

FIG. 1 is a flow chart depicting a method 100 of etching a low-k dielectric barrier layer positioned below a multi-layered mask where the low-k dielectric barrier layer is etched with a carbon-free etchant gas mixture according to some implementations described herein. Method 100 is performed upon a workpiece during the fabrication process. The method 100 described in FIG. 1 corresponds to the sequence of fabrication stages depicted in FIGS. 2A-2D, which is discussed below. FIGS. 2A-2D depict cross-sectional schematic views of a workpiece 200 including a substrate 210 having a low-k dielectric barrier layer 220 and patterned film stack 250 formed thereon during different stages of etching the low-k dielectric barrier layer.

Figure 2A:
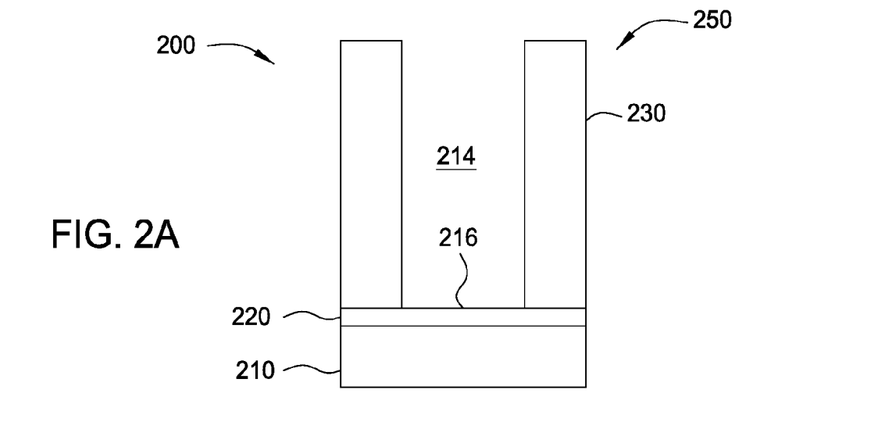

The method 100 begins with the workpiece 200 depicted in FIG. 2A including a substrate 210 having a low-k dielectric barrier layer 220 and patterned film stack 250 formed thereon. The workpiece 200 may be transferred into a processing chamber, such as the processing chamber 500 depicted in FIG. 5, or other suitable processing chamber. The substrate 210 may have a substantially planar surface, an uneven surface, or a substantially planar surface having a structure formed thereon. The substrate 210 may comprise a semiconductor substrate and may include fully or partially formed layers and/or devices. In some implementations, the substrate 210 may include a low-k dielectric layer having a metal interconnect structure formed therein. In one implementation, the substrate 210 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 210 may have various dimensions, such as 200 mm, 300 mm or 450 mm diameter wafers, as well as, rectangular or square panels. Unless otherwise noted, implementations and examples described herein are conducted on substrates with a 300 mm diameter or a 450 mm diameter.

In one implementation, the patterned film stack 250 includes a material layer 230. The material layer 230 is disposed on the low-k dielectric barrier layer 220 on the substrate 210. In one implementation, the material layer 230 may be utilized to form a gate structure, shallow trench isolation (STI) structure, a contact structure or an interconnect structure in the front end or back end processes. In one implementation, the method 100 may be performed on the material layer 230 to form a contact structure therein. The low-k dielectric barrier layer 220 may comprise any suitable layer of material, such as a silicon dielectric layer, for example, silicon nitride (SiN), silicon carbide (SiC), nitrogen doped silicon carbide (SiNC), silicon carbon nitride (SiCN), silicon carbon oxide (SiCO), oxygen and nitrogen doped silicon carbide (SiONC), or the like. The material layer 230 may include one or more dielectric layers selected from a group consisting of an oxide layer, a nitride layer, a refractory metal nitride layer (e.g., titanium nitride), a composite of oxide and nitride layer, at least one or more oxide layers sandwiching a nitride layer, and combinations thereof, among others. Other suitable materials for the dielectric layer include organosilicate glass (OSG), undoped silicon glass (USG), such as silicon oxide or TEOS, boron-silicate glass (BSG), phosphorus-silicate glass (PSG), boron-phosphorus-silicate glass (BPSG) and combinations thereof. One exemplary OSG dielectric layer is BLACK DIAMOND™ low-k dielectric film commercially available from Applied Materials, Inc. In an exemplary implementation depicted herein, the material layer 230 includes an undoped silicon glass (USG) layer. In one implementation, the material layer 230 has a thickness between about 300 Å to about 1,500 Å, such as between about 400 Å to about 1,200 Å, for example about 1,000 Å.

A patterned mask layer (not shown) is disposed on the material layer 230. The patterned mask layer has an open feature that exposes portions of the material layer 230 for etching. In one implementation, the mask layer may be a hardmask layer, a photoresist mask or a combination thereof. The open feature in the mask layer is used as an etch mask to form open feature 214 in the material layer 230 with desired aspect ratios. The open feature 214 described herein may include trenches, vias, openings and the like. The open feature 214 exposes a surface of the low-k dielectric barrier layer 220.

Figure 2B:
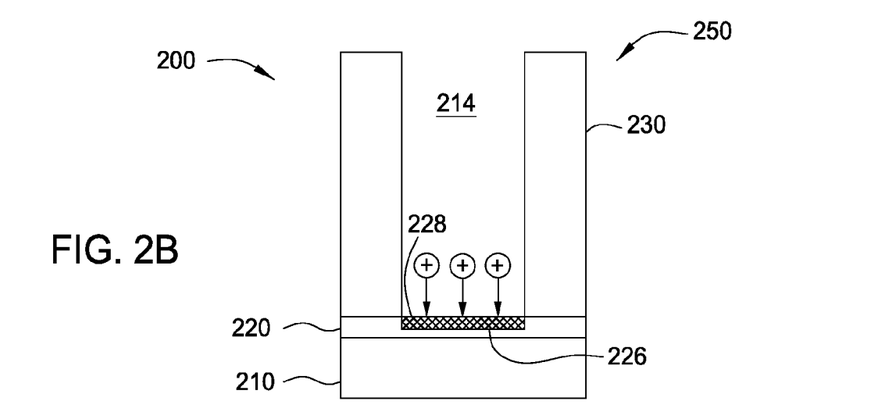

Returning to FIG. 1, at the process of block 110, an upper surface 216 of the low-k dielectric barrier layer 220 is exposed to a treatment gas plasma to alter the properties of the surface of the low-k dielectric barrier layer 220 to facilitate removal of at least a portion of the low-k dielectric barrier layer 220 in the subsequent chemical etching process. The treatment process performed at block 110 includes supplying a treatment gas mixture into the processing chamber 500. A plasma is then formed from the treatment gas mixture to plasma treat the upper surface 216 of the low-k dielectric barrier layer 220 to activate at least a portion of the low-k dielectric barrier layer 220 into an excited state, forming a treated low-k dielectric barrier layer 226 having a treated upper surface 228, as shown in FIG. 2B, which may then easily react with chemical etching gases subsequently supplied into the processing chamber 500, forming volatile gas byproducts which readily pumps out of the processing chamber 500.

In one implementation, the treatment gas mixture includes at least one of a hydrogen containing gas, a nitrogen containing gas or an inert gas. It is believed that the hydrogen containing gas, the nitrogen containing gas, or inert gas supplied in the treatment gas mixture may assist increasing the lifetime of the ions in the plasma formed from the treatment gas mixture. Increased lifetime of the ions may assist reacting with and activating the treated low-k dielectric barrier layer 226 more thoroughly, thereby enhancing the removal of the treated low-k dielectric barrier layer 226 from the substrate 210 during the subsequent chemical etching process. In implementations where the nitrogen containing gas is utilized in the treatment gas mixture, the nitrogen atoms from the nitrogen containing gas may react with the oxygen atoms in the low-k dielectric barrier layer 220 to form a nitrogen-oxygen (NO or NO*) compound in a volatile, which may be easily removed from the substrate surface and pumped out of the processing chamber. In the implementation wherein the hydrogen containing gas is utilized in the treatment gas mixture, the hydrogen atoms from the hydrogen containing gas may react with the silicon atoms contained in the low-k dielectric barrier layer 220, thereby forming weak and dangling bonds of Si—H or Si—OH bond on the treated upper surface 228 of the treated low-k dielectric barrier layer 226. The treated low-k dielectric barrier layer 226 with Si—H or Si—OH bond terminals may be easily absorbed by other etchants subsequently supplied to the processing chamber 500, thereby assisting ease of removal of the treated low-k dielectric barrier layer 226 from the substrate surface. Similarly, in implementations wherein an inert gas, such as He or Ar, is utilized, the inert gas may treat and gently bombard the low-k dielectric barrier layer 220 to activate the low-k dielectric barrier layer 220 to an excited state, thereby assisting reaction with the etchants supplied to the processing chamber 500.

In one implementation, the hydrogen containing gas supplied into the processing chamber 500 includes at least one of $H_2$, $H_2O$, and the like. The nitrogen containing gas supplied into the processing chamber 500 includes at least one of $N_2$, $N_2O$, $NO_2$, $NH_3$ and the like. The inert gas supplied into the processing chamber 500 includes at least one of Ar, He, Kr, and the like. In an exemplary implementation, the hydrogen containing gas supplied in the processing chamber 500 to perform the treatment process is $H_2$ gas, and the nitrogen containing gas supplied in the processing chamber 500 to perform the treatment process is $N_2$ gas and the inert gas is He or Ar.

During the plasma treatment process, several process parameters may be regulated to control the pretreatment process. In one exemplary implementation, a process pressure in the processing chamber 500 is regulated between about 10 mTorr to about 5000 mTorr, such as between about 10 mTorr and about 200 mTorr. A low RF bias power at a frequency of about 13 MHz may be applied to maintain a plasma in the treatment gas mixture. For example, a RF bias power of about less than 200 Watts, such as between about 20 Watts to about 200 Watts, may be applied to maintain a plasma inside the processing chamber 500. The treatment gas mixture may be flowed into the chamber at a rate between about 200 sccm to about 800 sccm. A substrate temperature is maintained between about 25 degrees Celsius to about 300 degrees Celsius, such as between about 50 degrees Celsius and about 110 degrees Celsius.

In one implementation, the substrate is subjected to the treatment process for between about 5 seconds to about 5 minutes, depending on the operating temperature, pressure and flow rate of the gas. For example, the substrate can be exposed to the pretreatment processes for about 30 seconds to about 90 seconds. In an exemplary implementation, the substrate is exposed to the treatment process for about 90 seconds or less.

In the process of block 120, a chemical etching process is performed to remove the treated low-k dielectric barrier layer 226 from the substrate 210, as shown in FIG. 2C. The chemical etching process is performed by supplying a chemical etching gas mixture through the plasma cavity 550 into the processing chamber 500 to form a remote plasma in the plasma cavity 550 from the chemical etching gas mixture for etching the treated low-k dielectric barrier layer 226. As the treated low-k dielectric barrier layer 226 has been treated to have weak and dangling bonds with Si—H or Si—OH bond terminals on the surface, the aggressive etchants from the chemical etching gas mixture may easily attack the weak and dangling bonds with Si—H or Si—OH bond terminals and efficiently remove the treated low-k dielectric barrier layer 226 from the substrate 210 during the chemical etching process.

In one implementation, the chemical etching gas mixture used to remove the treated low-k dielectric barrier layer 226 is a mixture of ammonia ($NH_3$) and nitrogen trifluoride ($NF_3$) gases. The amount of each gas introduced into the processing chamber may be varied and adjusted to accommodate, for example, the thickness of the low-k dielectric barrier layer 220 to be removed, the geometry of the substrate being cleaned, the volume capacity of the plasma, the volume capacity of the chamber body, as well as the capabilities of the vacuum system coupled to the chamber body.

In one or more implementations, the gases added to provide a chemical etching gas mixture having at least a 1:1 molar ratio of ammonia ($NH_3$) to nitrogen trifluoride ($NF_3$). In one or more implementations, the molar ratio of the chemical etching gas mixture is at least about 3:1 (ammonia to nitrogen trifluoride). The gases are introduced in the chamber at a molar ratio of from about 5:1 (ammonia to nitrogen trifluoride) to about 30:1. In yet another implementation, the molar ratio of the chemical etching gas mixture is from about 5:1 (ammonia to nitrogen trifluoride) to about 10:1. The molar ratio of the chemical etching gas mixture can also fall between about 10:1 (ammonia to nitrogen trifluoride) and about 20:1. It is noted that the ratio between the ammonia ($NH_3$) to nitrogen trifluoride ($NF_3$) may also be adjusted to improve the etching selectivity, including the selectivity between the low-k dielectric barrier layer 220 and the material layer 230 (e.g., selectivity of the silicon oxide layer to silicon carbide layer).

In one implementation, the chemical etching gas mixture used to remove the treated low-k dielectric barrier layer 226 is a mixture of hydrogen ($H_2$) and nitrogen trifluoride ($NF_3$) gases. The amount of each gas introduced into the processing chamber may be varied and adjusted to accommodate, for example, the thickness of the low-k dielectric barrier layer 220 to be removed, the geometry of the substrate being cleaned, the volume capacity of the plasma, the volume capacity of the chamber body, as well as the capabilities of the vacuum system coupled to the chamber body.

In one or more implementations, the gases added to provide a chemical etching gas mixture having at least a 1:1 molar ratio of hydrogen ($H_2$) to nitrogen trifluoride ($NF_3$). In one or more implementations, the molar ratio of the chemical etching gas mixture is at least about 3:1 (hydrogen to nitrogen trifluoride). The gases are introduced in the chamber at a molar ratio of from about 5:1 (hydrogen to nitrogen trifluoride) to about 30:1. In yet another implementation, the molar ratio of the chemical etching gas mixture is from about 5:1 (hydrogen to nitrogen trifluoride) to about 10:1. The molar ratio of the chemical etching gas mixture can also fall between about 10:1 (hydrogen to nitrogen trifluoride) and about 20:1. It is noted that the ratio between the hydrogen ($H_2$) to nitrogen trifluoride ($NF_3$) may also be adjusted to improve the etching selectivity, including the selectivity between the low-k dielectric barrier layer 220 and the material layer 230 (e.g., selectivity of the silicon oxide layer to silicon carbide layer).

As the low-k dielectric barrier layer 220 often has a relatively thin thickness, as compared to the material layer 230 disposed above, the plasma generated remotely in the plasma cavity 550 during the chemical etching process at block 120 may have the etchants dissociated to form a relatively mild and gentle etchant, so as to slowly, gently and gradually etch the treated low-k dielectric barrier layer 226 until the underlying substrate 210 or remaining portion of the low-k dielectric barrier layer 220 is exposed. As compared to conventional in-situ plasma etching processes, the chemical etching process performed at block 120 to remove the treated low-k dielectric barrier layer 226 may be controlled to proceed at a slow rate utilizing a remote plasma source, such as between about 1 Å per second and about 10 Å per second, so as to provide good control for the interface etching, thereby allowing precise etching end point for the treated low-k dielectric barrier layer 226 being removed from the substrate 210 without damaging the adjacent material layer 230. The chemical etching process is configured to chemically react and remove the treated low-k dielectric barrier layer 226 from the substrate 210 without overly aggressive and physical bombarding, sputtering or biasing the substrate surface, thereby providing a mild etching process that slowly removes the treated low-k dielectric barrier layer 226. Each cycle of the chemical etching process may only etch away about 25 Å of the treated low-k dielectric barrier layer 226 to slowly remove the treated low-k dielectric barrier layer 226 with good profile control, thereby reducing likelihood of over-etching to the substrate, profile deformation, or loss of CD control.

Furthermore, it is believed that the etchants, such as $NH_3$ and $NF_3$, may aggressively react with the treated low-k dielectric barrier layer 226 while gently reacting with the oxygen atoms/oxygen radials released from the material layer 230. The nitrogen elements dissociated from the etching gas mixture may promptly react with the oxygen elements released from the material layer 230, which is dissociated either during the treatment process at block 110 or the chemical etching process at block 120. The nitrogen elements and the oxygen elements are then reacted to form a nitrogen-oxygen (NO, or NO*) compound, protecting sidewalls of the open feature 214 in the material layer 230 and helping to etch the low-k dielectric barrier layer 220 efficiently. As the sidewall of the material layer 230 is protected, it helps confining the etchants to have a desired directionality to anisotropically etch the treated low-k dielectric barrier layer 226, thereby enhancing the etching efficiency and profile control. Additionally, the nitrogen-oxygen (NO, or NO*) compound generated during the etching process may also be in a volatile state, which may be easily removed from the substrate surface and pumped out of the processing chamber after the etching process.

During the chemical etching process, several process parameters may be regulated to control the chemical etching process of block 120. In one exemplary implementation, a process pressure in the processing chamber 500 is regulated to between about 10 mTorr and about 5000 mTorr, such as between about 800 mTorr and about 5 Torr, for example about 1500 mTorr. A RF source power is provided at a frequency of about 60 MHz to maintain a plasma in the chemical etching gas mixture. For example, a RF source power of about 20 Watts to about 800 Watts, such as about 400 Watts, may be chemical etching gas mixture may be flowed into the chamber at a rate between about 15 sccm to about 200 sccm. In one example, the $NH_3$ gas may be supplied in the etching gas mixture at a rate between about 5 sccm and about 300 sccm, such as between about 20 sccm and about 300 sccm, such as about 100 sccm. The $NF_3$ gas may be supplied in the etching gas mixture at a rate between about 5 sccm and about 300 sccm, such as between about 5 sccm and about 50 sccm, such as about 20 sccm. In one implementation, an inert gas, such as Ar or He, may also be supplied in the etching gas mixture. In one implementation, a He gas is used and supplied in the etching gas mixture between about 200 sccm and about 1000 sccm, such as about 600 sccm. A substrate temperature is maintained between about 25 degrees Celsius to about 300 degrees Celsius, such as between about 50 degrees Celsius and about 150 degrees Celsius, for example about 110 degrees Celsius. In one implementation, no bias power is provided during the chemical etching process to reduce ion bombardment.

In the implementation depicted in FIG. 2C, after the first cycle of the chemical etching, the treated low-k dielectric barrier layer 226 may have a thickness 234 of between about 20 Å and about 50 Å removed from the substrate 210.

At the process of block 130, an optional transition process may be performed to remove etching residuals from the substrate surface. A transition gas mixture including a purge gas or carrier gas can be supplied to the processing chamber to assist pumping/purging the etching residuals from the processing chamber. Suitable purge/carrier gases include argon, helium, hydrogen, nitrogen, or mixtures thereof. The operating pressure within the chamber can be varied. Application of the RF source or RF bias powers may be eliminated during the pump/purge process, e.g., the transition process is performed without applying a RF power during the transition process. The purge/carrier gas can be used to facilitate the pump/purge of the etching residuals from the processing chamber. In one implementation, the substrate is subjected to the transition process for between about 5 seconds to about 5 minutes. For example, the substrate can be exposed to the transition process for about 5 seconds to about 10 seconds. In an exemplary implementation, the substrate is exposed to the transition process for about 5 seconds.

Figure 2D:
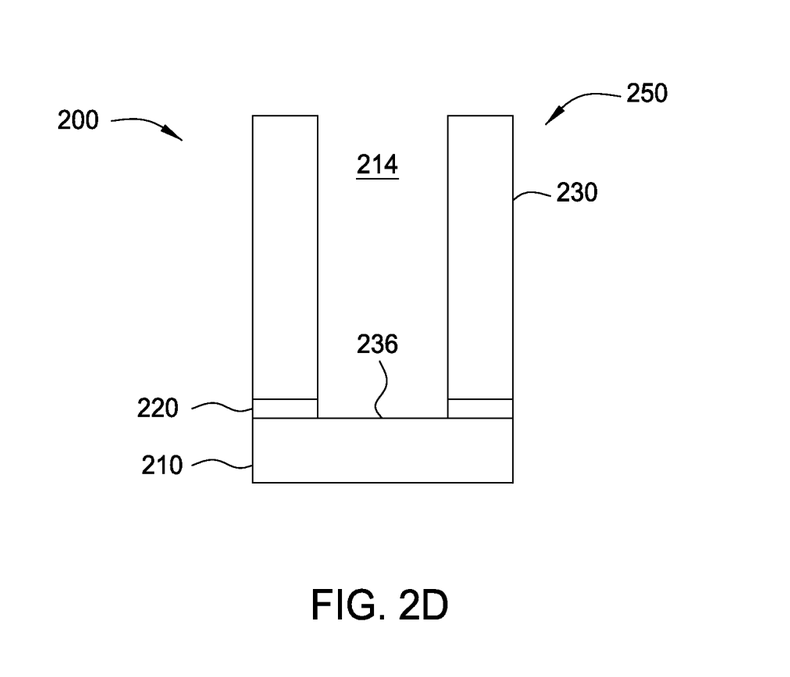

At the process of block 140, it may be determined whether the low-k dielectric barrier layer 220 has been removed. It is noted that the processes of blocks 110, 120 and 130 may be repeatedly (i.e., cyclically) performed, as indicated by the loop 160 in FIG. 1, until the low-k dielectric barrier layer 220 exposed by the open feature 214 is removed as shown in FIG. 2D, exposing a surface 236 of the underlying substrate 210. In one implementation, the low-k dielectric barrier layer 220 may have a thickness between about 5 nm and about 500 nm, such as about 10 nm and about 35 nm. The repeated processes may cyclically and incrementally etch the treated low-k dielectric barrier layer 220 without over aggressively attacking the material layer 230, thereby providing a good interface etching control and a proper etch stop endpoint. Incremental etching with repetitive treatment, chemical etching process and/or the optional transition process that improves feature verticality and promotes etching selectivity among the material layer 230, the low-k dielectric barrier layer 220 and the underlying substrate 210, thereby enhancing accuracy of mask to transfer feature critical dimensions (CD) from the mask layer and the material layer 230 to the low-k dielectric barrier layer 220.

After removal of the low-k dielectric barrier layer 220 the workpiece 200 may be exposed to additional processing including, for example, metal gap fill processes, the deposition of additional layers and material removal processes (e.g., chemical mechanical polishing processes).

Figure 3:
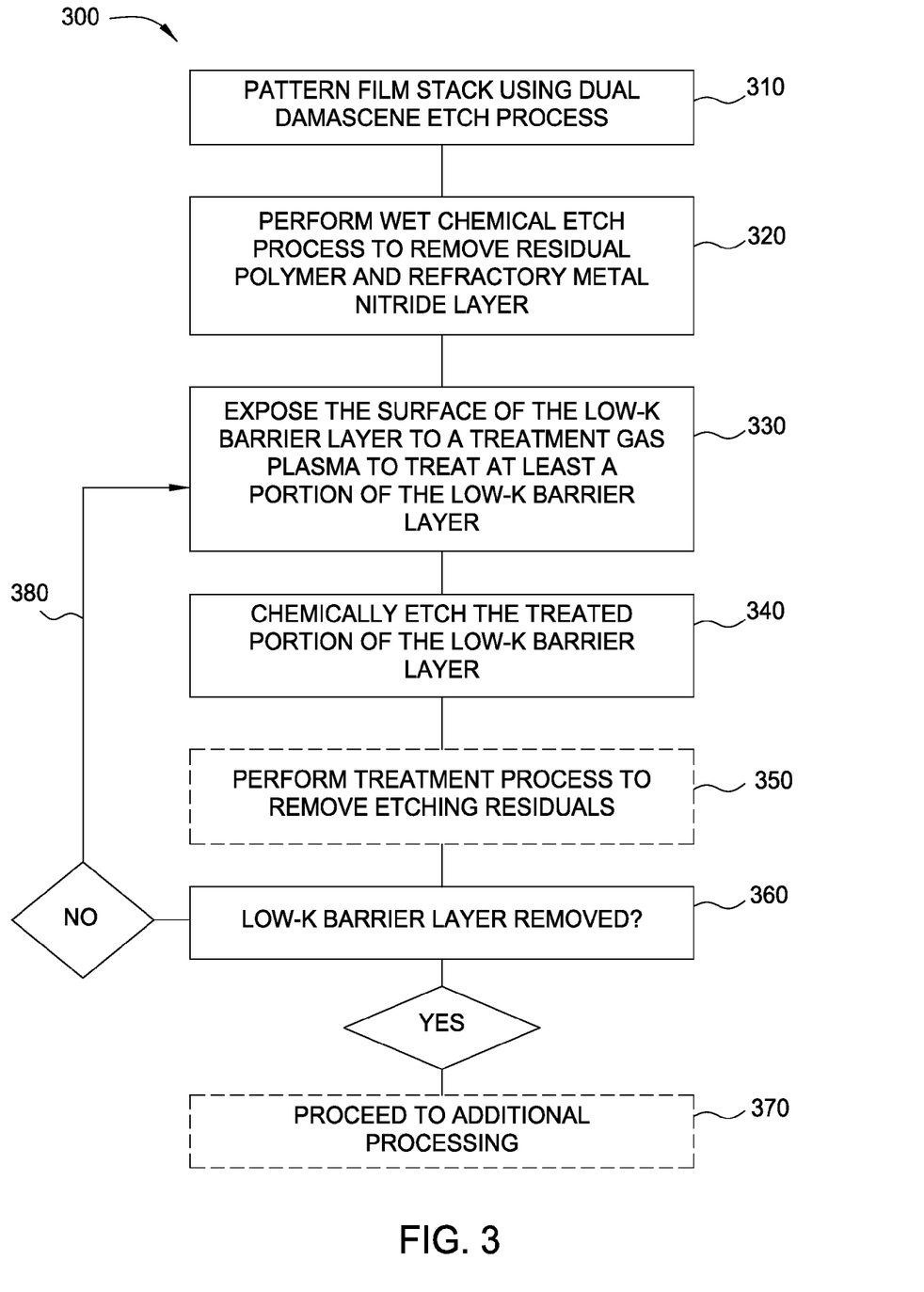
FIG. 3 is a flow chart depicting a method of etching/forming a dual damascene structure according to some implementations described herein.
Figure 4A:
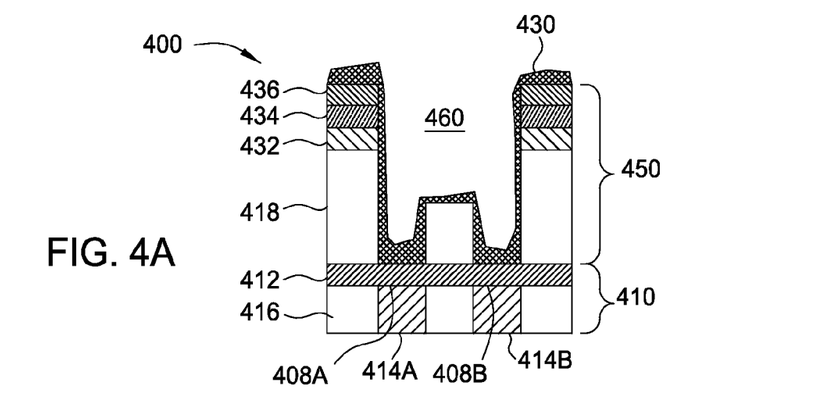
FIGS. 4A-4H depict cross-sectional schematic views of a workpiece processed according to implementations of the method of FIG. 3.

FIG. 3 is a flow chart depicting a method 300 of etching/forming a dual damascene structure according to some implementations described herein. Method 300 is performed upon a workpiece 400 during the fabrication process. The method 300 corresponds to the sequence of fabrication stages depicted in FIGS. 4A-4H, which are discussed below. FIGS. 4A-4H depict cross-sectional schematic views of the fabrication steps of a dual damascene structure formed on a substrate 410. The substrate 410 has a patterned film stack 450 formed thereon. The substrate 410 may include a semiconductor substrate and may include fully or partially formed layers and/or devices formed therein or thereupon. For example, in some implementations, and as depicted in FIG. 4A, the substrate may have a low-k dielectric barrier layer 412 disposed on top of a metal interconnect structure 414a, 414b (collectively 414) formed in a low-k dielectric layer 416. The low-k dielectric barrier layer 412 may comprise any suitable layer of material, such as silicon nitride (SiN), silicon carbide (SiC), nitrogen doped silicon carbide (SiNC), silicon carbon nitride (SiCN), silicon carbon oxide (SiCO), oxygen and nitrogen doped silicon carbide (SiONC), or the like. One example of such a silicon carbide based material is BLOk™ (barrier low-k) film, which is available from Applied Materials, Inc. of Santa Clara, Calif. The metal interconnect structure 414 may comprise a conductive material, such as a metal, for example copper (Cu), gold (Au), aluminum (Al) or the like. The metal interconnect structure 414 may have an upper surface 408a, 408b (collectively 408) that is substantially coplanar or flush with an upper surface of the low-k dielectric layer 416. The low-k dielectric layer 416 may be any organic, low-k dielectric material having a dielectric constant that is less than the dielectric constant of silicon dioxide ($SiO_2$), which is about 3.9. Suitable materials for the low-k dielectric layer 416 include carbon doped oxide (CDO), organosilicate glass (OSG), undoped silicon glass (USG), such as silicon oxide or TEOS, boron-silicate glass (BSG), phosphorus-silicate glass (PSG), boron-phosphorus-silicate glass (BPSG) and combinations thereof.

In one implementation, the patterned film stack 450 includes a low-k dielectric layer 418 and one or more top layers or mask layers 432, 434, 436 disposed thereon. The low-k dielectric layer 418 may be deposited on top of the substrate 410 (e.g., on top of the low-k dielectric barrier layer 412 when present, or any other layer that may be present on the substrate 410). The low-k dielectric layer 418 may be disposed on the low-k dielectric barrier layer 412. The low-k dielectric layer 418 may be selected from the same materials as the low-k dielectric layer 416. The one or more mask layers 432, 434, 436 may each individually be a dielectric layer selected from a group consisting of an oxide layer, a nitride layer, a metal layer, a refractory metal nitride layer, a composite of oxide and nitride layer, at least two or more oxide layers sandwiching a nitride layer, and combinations thereof, among others. Exemplary refractory metal nitride layers are selected from the group consisting of titanium nitride, tantalum nitride and tungsten nitride. Exemplary metal layers include titanium and tungsten.

The low-k dielectric layer 418 may be any organic, low-k dielectric material having a dielectric constant that is less than the dielectric constant of silicon dioxide ($SiO_2$), which is about 3.9. For example, the organic material may be a carbon doped oxide (CDO) (such as Black Diamond or Black Diamond II, available from Applied Materials), an organosilicate glass (OSG) material, a polymer-based low-k dielectric material (such as SiLK®, available from Dow Chemical Company), an organic polymer (such as FLARE™, a bridged poly-arylene ether available from Honeywell Advanced Microelectronic Materials), or the like. In an exemplary implementation depicted herein, the low-k dielectric layer 418 is an organosilicate glass (OSG) layer. In another exemplary implementation depicted herein, the low-k dielectric layer 418 is a carbon doped oxide. In one implementation, the low-k dielectric layer 418 has a thickness between about 300 Å to about 1,500 Å, such as between about 400 Å to about 1,200 Å, for example about 1,000 Å. In one implementation, mask layer 432 is a silicon rich oxide or SiON layer, mask layer 434 is an oxide layer and mask layer 436 is a titanium containing layer (e.g., titanium nitride or titanium layer).

Referring to FIG. 3, at the process of block 310 the film stack is patterned to form the patterned film stack 450 as shown in FIG. 4A. The patterned film stack 450 may be patterned using a series of processes known to those of ordinary skill in the art to form open features 460 in the patterned film stack 450. The open features 460 typically expose portions of an upper surface 420 of the low-k dielectric barrier layer 412. The open features 460 described herein may include trenches, vias, openings and the like. The open features 460 may be formed using a plasma etch process that includes a process gas or process gas mixture comprising a fluorocarbon gas, a nitrogen-containing gas, and an inert gas. As used herein, the phrases "a process gas" and "a process gas mixture" are interchangeable and may include one or more gases. Optionally, a hydrofluorocarbon gas may also be provided. In some implementations, the fluorocarbon gas may be hexafluoro-1,3-butadiene ($C_4F_6$), octafluorocyclobutane ($C_4F_8$), octafluorocyclopentene ($C_5F_8$), hexafluorobenzene ($C_6F_6$), tretrafluoromethane ($CF_4$), hexafluoroethane ($C_2F_6$), or the like. The nitrogen-containing gas may be nitrogen ($N_2$). The inert gas may comprise argon (Ar), helium (He), xenon (Xe), or other inert gases. The hydrofluorocarbon gas may be difluoromethane ($CH_2F_2$), trifluoromethane ($CHF_3$), methyl fluoride ($CH_3F$), or the like. In some implementations, the process gas mixture may include $C_4F_6$, $CH_2F_2$, $N_2$, and Ar. During formation of the open feature 460, a polymer layer 430 typically forms over exposed surfaces of the patterned film stack 450 as shown in FIG. 4A. In implementations where the patterned film stack 450 is patterned using $CF_x$ based gases, the polymer layer 430 is a $CF_x$ based polymer that is typically removed using aggressive cleaning processes.

Figure 4B:
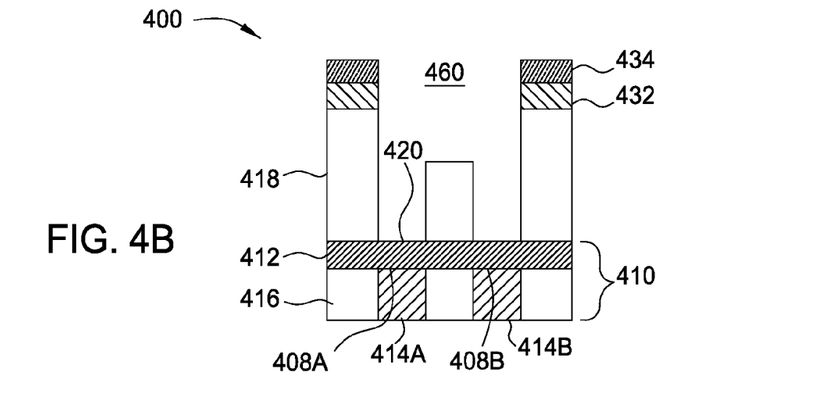

Referring to FIG. 3, at the process of block 320 a wet chemical etch process is performed to remove the polymer layer 430 and the mask layer 436 (e.g., refractory metal nitride layer) as shown in FIG. 4B. In some implementations, the polymer layer 430 and the mask layer 436 are removed in a single step process. In some implementations, the polymer layer 430 and the mask layer 436 are removed in a multi-step process. In some implementations, the wet chemical may comprise, for example, a hydrofluoric acid solution. In some implementations, the concentration of the hydrofluoric acid solution may range between about 1-5 percent. As depicted in FIG. 4B, as the low-k dielectric barrier layer 412 is protects the metal interconnect structures 414a, 414b during the wet chemical etch process.

Figure 4C:
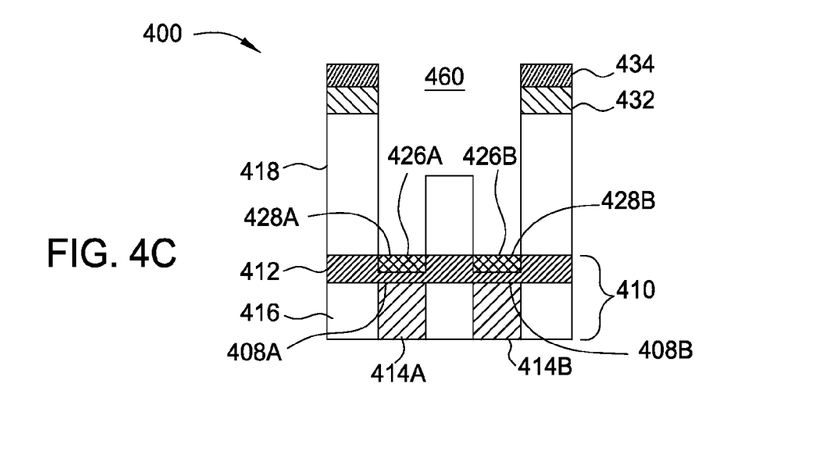

Referring to FIG. 3, at the process of block 330, similar to the process of block 110, the exposed portions of the upper surface 420 of the low-k dielectric barrier layer 412 are exposed to a treatment gas plasma to alter the properties of the surface of the low-k dielectric barrier layer 412 to facilitate removal of at least a portion of the low-k dielectric barrier layer 412 in the subsequent chemical etching process. The treatment process performed at block 110 includes supplying a treatment gas mixture into the processing chamber 500. A plasma is then formed from the treatment gas mixture to plasma treat the upper surface 420 of the low-k dielectric barrier layer 412 to activate at least a portion of the low-k dielectric barrier layer 412 into an excited state, forming a treated barrier layer 426a, 426b (collectively 426) having a treated upper surface 428a, 428b (collectively 428), as shown in FIG. 4C, which may then easily react with chemical etching gases subsequently supplied into the processing chamber 500, forming volatile gas byproducts which readily pumps out of the processing chamber 500. The process of block 330 may be performed using the process conditions and gases as described for the process of block 110.

Referring to FIG. 3, at the process of block 340, a chemical etching process is performed to slowly remove the treated barrier layer 426 from the substrate 410, as shown in FIG. 4C. The chemical etching process is performed by supplying a chemical etching gas mixture through the plasma cavity 550 into the processing chamber 500 to form a remote plasma in the plasma cavity 550 from the chemical etching gas mixture for etching the low-k dielectric barrier layer 412. As the treated barrier layer 426 has been treated to have weak and dangling bonds with Si—H or Si—OH bond terminals on the surface, the aggressive etchants from the chemical etching gas mixture may easily attack the weak and dangling bonds with Si—H or Si—OH bond terminals and efficiently remove the treated barrier layer 426 from the substrate 410 during the chemical etching process. The process of block 340 may be performed using the process conditions and gases as described for the process of block 120.

Figure 4D:
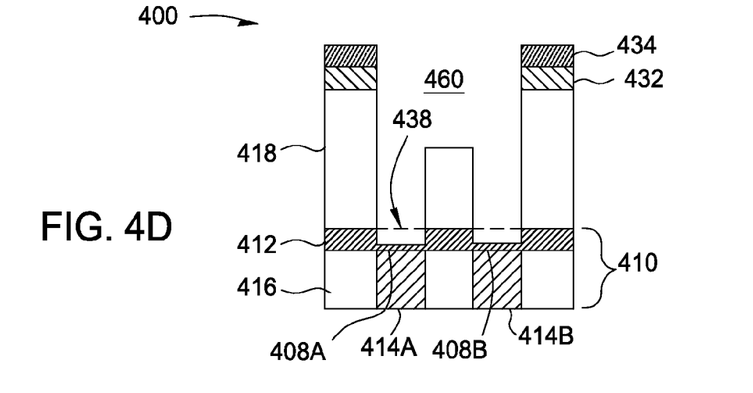

At the process of block 350, an optional transition process may be performed to remove etching residuals from the substrate surface as shown in FIG. 4D. A transition gas mixture including a purge gas or carrier gas can be supplied to the processing chamber to assist pumping/purging the etching residuals from the processing chamber. Suitable purge/carrier gases include argon, helium, hydrogen, nitrogen, or mixtures thereof. The operating pressure within the chamber can be varied. Application of the RF source or RF bias powers may be eliminated during the pump/purge process, e.g., the transition process is performed without applying a RF power during the transition process. The purge/carrier gas can be used to facilitate the pump/purge of the etching residuals from the processing chamber. In one implementation, the substrate is subjected to the transition process for between about 5 seconds to about 5 minutes. For example, the substrate can be exposed to the transition process for about 5 seconds to about 10 seconds. In an exemplary implementation, the substrate is exposed to the transition process for about 5 seconds.

In the implementation depicted in FIG. 4D, after the first cycle of the chemical etching, the treated barrier layer 426 may have a thickness 438 of between about 20 Å and about 50 Å removed from the substrate 410.

Figure 4E:
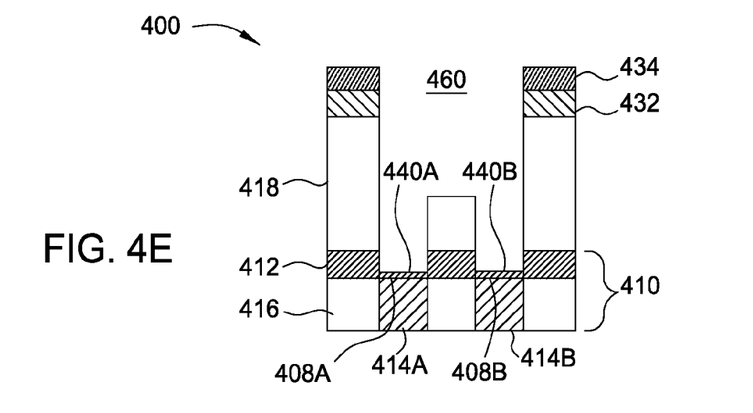
Figure 4F:
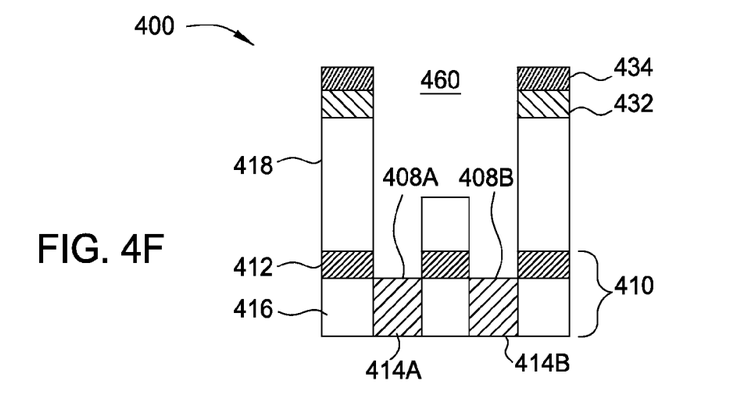

At the process of block 360, it may be determined whether the low-k dielectric barrier layer 412 has been removed. It is noted that processes of blocks 330, 340 and 350 may be repeatedly (i.e., cyclically) performed, as indicated by the loop 380 in FIG. 3, until the low-k dielectric barrier layer 412 exposed by the open feature 460 is removed as determined in block 360, as shown in FIG. 4F, exposing the upper surface 408a, 408b of each metal interconnect structure 414a, 414b of the underlying substrate 410. As shown in FIG. 4E, a remaining portion of the exposed low-k dielectric barrier layer 412 is treated to form treated barrier layer 440a, 440b (collectively 440) and removed by repeating the processes of blocks 330, 340 and 350 to expose the upper surface 408a, 408b of each metal interconnect structure 414a, 414b of the underlying substrate 410.

In one implementation, the low-k dielectric barrier layer 412 may have a thickness between about 5 nm and about 500 nm, such as about 10 nm and about 35 nm. The repeated processes may cyclically and incrementally etch the low-k dielectric barrier layer 412 without over aggressively attacking the low-k dielectric layer 418, thereby providing a good interface etching control and a proper etch stop endpoint. Incremental etching with repetitive treatment, chemical etching process and/or the optional transition process that improves feature verticality and promotes etching selectivity among the low-k dielectric layer 418, the low-k dielectric barrier layer 412 and the underlying substrate 410, thereby enhancing accuracy of mask to transfer feature critical dimensions (CD) from the mask layer and the low-k dielectric layer 418 to the low-k dielectric barrier layer 412.

Figure 4G:
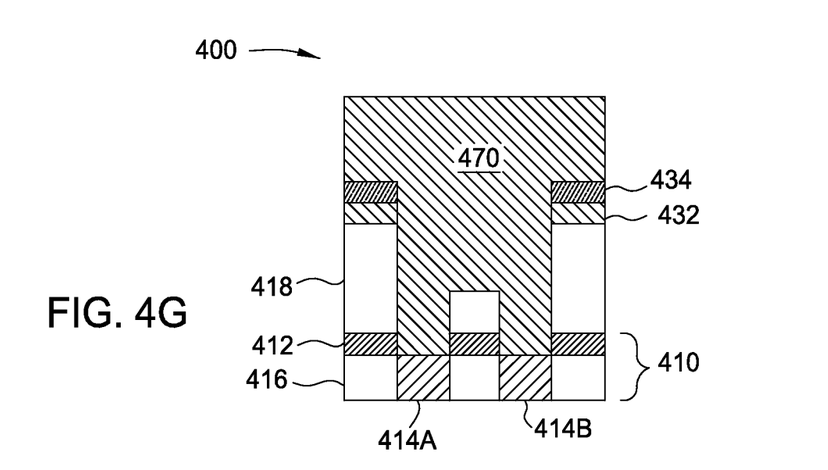
Figure 4H:
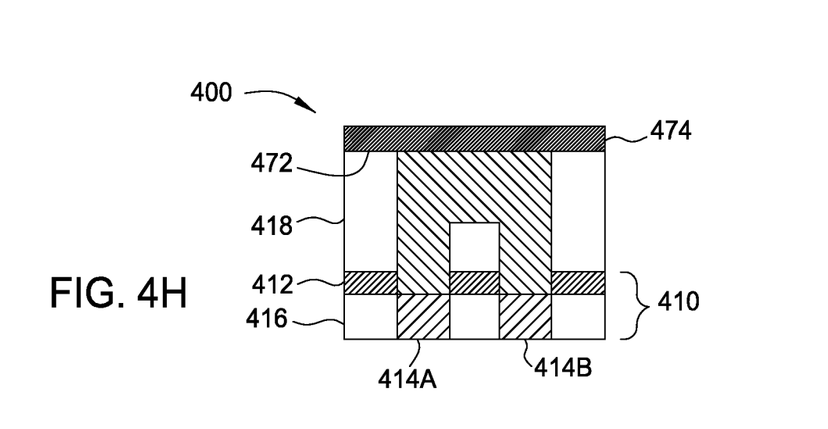

After removal of the low-k dielectric barrier layer 412 to expose the upper surface expose the upper surface 408a, 408b of each metal interconnect structure 414a, 414b of the underlying substrate 410. Additional processing of the workpiece 400 may be performed at the process of block 370. For example, the dual damascene structure may be filled with a conductive material 470, as shown in FIG. 4G. The conductive material 470 may comprise any suitable materials, for example metals, such as copper, aluminum, alloys thereof, or the like. The conductive material 470 may be deposited by any suitable process, such as plating, chemical or physical deposition, or the like. The workpiece 400 may be exposed to a polishing process (e.g., chemical mechanical polishing) to remove a portion of the conductive material 470, mask layer 432 and mask layer 434 to expose a top portion 472 of the low-k dielectric layer 418 followed by deposition of a barrier layer 474. After deposition of the barrier layer 474, the process ends and the substrate may continue for further processing, for example, to complete the formation of devices being formed thereon, or otherwise as desired.

Figure 5:
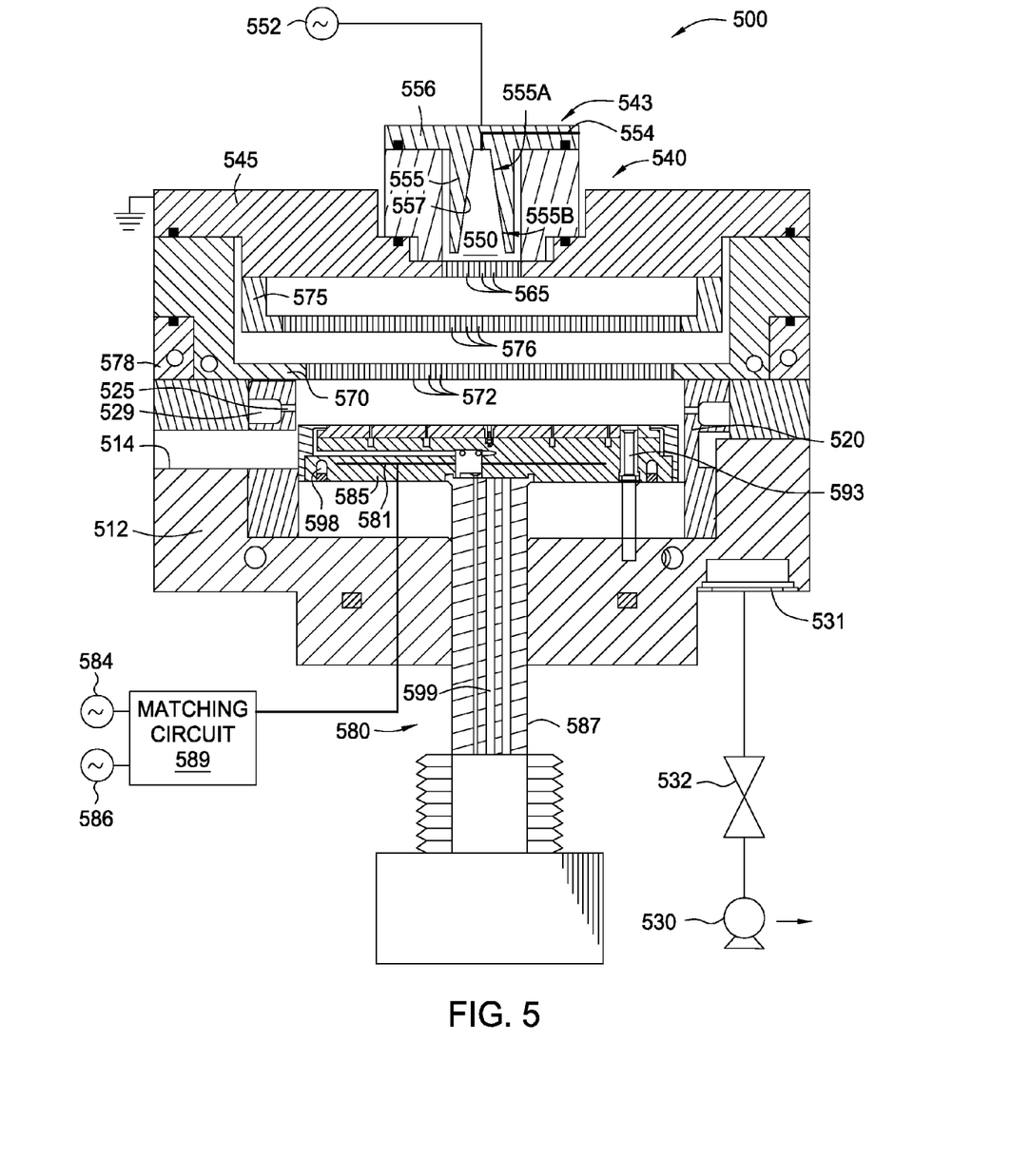
FIG. 5 depicts a cross-sectional schematic view of a plasma etch apparatus adapted to perform the etching methods described herein.

FIG. 5 depicts a cross-sectional schematic view of a plasma etch processing chamber 500 adapted to perform the etching methods described herein. The processing chamber 500 may be configured to remove materials from a material layer disposed on a substrate surface. The processing chamber 500 is particularly useful for performing the plasma assisted dry etch process. The processing chamber 500 may be a SICONI® chamber, which is available from Applied Materials, Santa Clara, Calif. It is noted that other vacuum processing chambers available from other manufactures may also be utilized to practice the present disclosure.

The processing chamber 500 provides both heating and cooling of a substrate surface without breaking vacuum. In one implementation, the processing chamber 500 includes a chamber body 512, a lid assembly 540, and a support assembly 580 having a support member 585. The lid assembly 540 is disposed at an upper end of the chamber body 512, and the support assembly 580 is at least partially disposed within the chamber body 512.

The chamber body 512 can include a liner 520 that surrounds the support assembly 580. The liner 520 is removable for servicing and cleaning. The liner 520 can be made of a metal such as aluminum, a ceramic material, or any other process compatible material. The liner 520 can be bead blasted to increase surface roughness and/or surface area which increases the adhesion of any material deposited thereon, thereby preventing flaking of material, which results in contaminants of the processing chamber 500. In one or more implementations, the liner 520 includes one or more apertures 525 and a pumping channel 529 formed therein that is in fluid communication with a vacuum system. The apertures 525 provide a flow path for gases into the pumping channel 529, which provides an egress for the gases within the processing chamber 500.

The vacuum system can include a vacuum pump 530 and a throttle valve 532 to regulate flow of gases through the processing chamber 500. The vacuum pump 530 is coupled to a vacuum port 531 disposed in the chamber body 512 and therefore, in fluid communication with the pumping channel 529 formed within the liner 520.

The lid assembly 540 includes at least two stacked components configured to form a plasma volume or cavity therebetween. In one or more implementations, the lid assembly 540 includes a first electrode 543 ("upper electrode") disposed vertically above a second electrode 545 ("lower electrode") confining a plasma volume or cavity 550 therebetween. The first electrode 543 is connected to a power source 552, such as an RF power supply, and the second electrode 545 is connected to ground, forming a capacitance between the first electrode 543 and the second electrode 545. In one or more implementations, the second electrode 545 can include a plurality of gas passages or apertures 565 formed beneath the plasma cavity 550 to allow gas from the plasma cavity 550 to flow therethrough.

In one or more implementations, the lid assembly 540 includes one or more gas inlets 554 (only one is shown) that are at least partially formed within an upper section 556 of the first electrode 543. The one or more process gases enter the lid assembly 540 via the one or more gas inlets 554. The one or more gas inlets 554 are in fluid communication with the plasma cavity 550 at a first end thereof and coupled to one or more upstream gas sources and/or other gas delivery components, such as gas mixers, at a second end thereof.

In one or more implementations, the first electrode 543 has an expanding section 555 that houses the plasma cavity 550. In one or more implementations, the expanding section 555 is an annular member that has an inner surface or diameter 557 that gradually increases from an upper portion 555A thereof to a lower portion 555B thereof. As such, the distance between the first electrode 543 and the second electrode 545 is variable. That varying distance helps control the formation and stability of the plasma generated within the plasma cavity 550.

The lid assembly 540 can further include a distribution plate 570 and blocker plate 575 adjacent the second electrode 545. The second electrode 545, distribution plate 570 and blocker plate 575 can be stacked and disposed on a lid rim 578, which is connected to the chamber body 512.

The distribution plate 570 is substantially disc-shaped and also includes a plurality of apertures 572 or passageways to distribute the flow of gases therethrough. In one or more implementations, the second electrode 545 can include a plurality of gas passages or apertures 565 formed beneath the plasma cavity 550 to allow gas from the plasma cavity 550 to flow therethrough. The blocker plate 575 includes a plurality of apertures 576 to provide a plurality of gas passages from the second electrode 545 to the distribution plate 570. The apertures 576 can be sized and positioned about the blocker plate 575 to provide a controlled and even flow distribution of gases to the distribution plate 570.

A substrate (not shown) is transferred into the processing chamber 500 through a slit valve opening 514 formed in a sidewall thereof to provide access to the interior of the processing chamber 500. In some implementations, the substrate may be secured to the support member 585 using a vacuum chuck. In one or more implementations, the substrate may be secured to the support member 585 using an electrostatic chuck. The electrostatic chuck typically includes at least a dielectric material that surrounds an electrode 581, which may be located in the support member 585 or formed as an integral part of the support member 585. The dielectric portion of the chuck electrically insulates the chuck electrode from the substrate and from the remainder of the support assembly 580.

In one implementation, the electrode 581 is coupled to a plurality of RF power bias sources 584, 586. The RF bias power sources 584, 586 are coupled to the electrode 581 disposed in the support member 585. The RF bias power excites and sustains a plasma discharge formed from the gases disposed in the processing region of the chamber body.

In the implementation depicted in FIG. 5, the dual RF bias power sources 584, 586 are coupled to the electrode 581 disposed in the support member 585 through a matching circuit 589. The signal generated by the RF bias power sources 584, 586 is delivered through matching circuit 589 to the support member 585 through a single feed to ionize the gas mixture provided in the plasma processing chamber 500, thereby providing ion energy necessary for performing a deposition or other plasma enhanced process. The RF bias power sources 584, 586 are generally capable of producing an RF signal having a frequency of from about 50 kHz to about 200 MHz and a power between about 0 Watts and about 5000 Watts. Additional bias power sources may be coupled to the electrode 581 to control the characteristics of the plasma as needed.

The temperature of the support assembly 580 can be controlled by a fluid circulated through a fluid channel 598 embedded in the body of the support member 585. In one or more implementations, the fluid channel 598 is in fluid communication with a heat transfer conduit 599 disposed through a shaft 587 of the support assembly 580. The fluid channel 598 is positioned about the support member 585 to provide a uniform heat transfer to the substrate receiving surface of the support member 585. The fluid channel 598 and heat transfer conduit 599 can flow heat transfer fluids to either heat or cool the support member 585. Any suitable heat transfer fluid may be used, such as water, nitrogen, ethylene glycol, or mixtures thereof. The support assembly 580 can further include an embedded thermocouple (not shown) for monitoring the temperature of the support surface of the support member 585. For example, a signal from the thermocouple may be used in a feedback loop to control the temperature or flowrate of the fluid circulated through the fluid channel 598.

The support member 585 can be moved vertically within the chamber body 512 so that a distance between support member 585 and the lid assembly 540 can be controlled.

In operation, the support member 585 can be elevated to a close proximity of the lid assembly 540 to control the temperature of the substrate being processed. As such, the substrate can be heated via radiation emitted from the distribution plate 570. Alternatively, the substrate can be lifted off the support member 585 to close proximity of the heated lid assembly 540 using lift pins 593.

A system controller (not shown) can be used to regulate the operations of the processing chamber 500. The system controller can operate under the control of a computer program stored on a memory of a computer. For example, the computer program can dictate the process sequencing and timing, mixture of gases, chamber pressures, RF power levels, susceptor positioning, slit valve opening and closing, wafer cooling and other parameters of a particular process.

While the foregoing is directed to implementations of the present disclosure, other and further implementations of the disclosure may be devised without departing from the basic scope thereof, and the scope thereof is determined by the claims that follow.

The invention claimed is:

1. A method for fabricating a dual damascene structure comprising:
   (a) plasma etching a via through a hardmask layer into a low-k dielectric material disposed on a substrate to expose at least a portion of a low-k barrier layer, wherein the low-k barrier layer contacts an underlying conductive material;
   (b) performing a wet chemical etch process to remove a residual polymer material formed during the plasma etching a via;
   (c) exposing a surface of the exposed portion of the low-k barrier layer to a treatment gas mixture to modify at least a portion of the exposed portion of the low-k barrier layer; and
   (d) chemically etching the modified portion of the exposed portion of the low-k barrier layer by exposing the modified portion to a chemical etching gas mixture, wherein the chemical etching gas mixture includes at least an ammonium gas and a nitrogen trifluoride gas or at least a hydrogen gas and a nitrogen trifluoride gas.

2. The method of claim 1, further comprising:
   (e) supplying a transition gas mixture, wherein the transition gas mixture includes an inert gas.

3. The method of claim 2, wherein supplying the transition gas mixture further comprises:
   supplying the transition gas mixture to remove etching residual without applying a RF power.

4. The method of claim 1, wherein the ammonium gas and the nitrogen trifluoride in the chemical etching gas mixture are at a molar ratio of from about 3:1 to about 30:1.

5. The method of claim 1, further comprising:
   repeating (c) and (d) until the exposed portion of the low-k barrier layer is removed from the substrate.

6. The method of claim 1, further comprises:
   applying a RF bias power to the treatment gas mixture; and
   applying a RF source power to the chemical etching gas mixture.

7. The method of claim 1, wherein performing a wet chemical etch process further comprises removing the hardmask layer.

8. The method of claim 1, wherein the low-k barrier layer is a silicon carbide nitride (SiCN) layer or a silicon carbide oxide (SiCO) layer, the hardmask layer is titanium nitride and the low-k dielectric material is a silicon oxide containing layer and the underlying conductive material is copper.

9. The method of claim 1, wherein the treatment gas mixture includes at least one of a hydrogen containing gas, a nitrogen containing gas, and an inert gas.

10. The method of claim 9, wherein the treatment gas mixture includes at least the hydrogen containing gas and the hydrogen containing gas includes at least one of $H_2$ and $H_2O$.

11. The method of claim 9, wherein the treatment gas mixture includes at least the nitrogen containing gas and the nitrogen containing gas includes at least one of $N_2$, $N_2O$, $NO_2$, and $NH_3$.

12. A method for fabricating a dual damascene structure comprising:
   (a) transferring a substrate having a silicon carbide layer disposed on a metal interconnect structure into a processing chamber, wherein the silicon carbide layer has a patterned silicon oxide layer along with a pattered mask layer disposed thereon exposing a portion of the silicon carbide layer;
   (b) performing a wet chemical etch process to remove a residual polymer material formed over the patterned silicon oxide layer and the patterned mask layer during a plasma etching process;

(c) supplying an argon or helium gas while applying a RF bias power to modify at least a portion of the exposed portion of the silicon carbide layer;

(d) supplying a chemical etching gas mixture including at least an ammonium gas and a nitrogen trifluoride gas or at least a hydrogen gas and a nitrogen trifluoride gas while applying a RF source power remotely from the processing chamber to etch the modified portion of the exposed portion of the silicon carbide layer; and (e) supplying argon or helium gas to the processing chamber without applying RF power.

13. The method of claim 12, further comprising:
repeating (c) to (e) until the exposed portion of the silicon carbide layer is removed exposing the underlying metal interconnect structure.

14. The method of claim 12, wherein the chemical etching gas mixture includes at least the ammonia gas and the nitrogen trifluoride at a molar ratio of the ammonia gas to the nitrogen trifluoride of at least about 3:1.

15. The method claim 14, wherein the molar ratio is from about 5:1 to about 10:1.

16. The method of claim 14, wherein the molar ratio is between about 10:1 to about 20:1.

17. The method of claim 12, wherein the chemical etching gas mixture includes at least the hydrogen gas and the nitrogen trifluoride at a molar ratio of the hydrogen gas to the nitrogen trifluoride of at least about 3:1.

18. The method of claim 17, wherein the molar ratio is from about 5:1 to about 30:1.

19. The method claim 18, wherein the molar ratio is from about 5:1 to about to about 10:1.

20. The method of claim 18, wherein the molar ratio is between about 10:1 to about 20:1.

* * * * *

UNITED STATES PATENT AND TRADEMARK OFFICE
CERTIFICATE OF CORRECTION

PATENT NO. : 9,514,953 B2  
APPLICATION NO. : 14/541978  
DATED : December 6, 2016  
INVENTOR(S) : Chia-Ling Kao et al.

Page 1 of 1

It is certified that error appears in the above-identified patent and that said Letters Patent is hereby corrected as shown below:

In the Specification

In Column 2, Line 66, delete "Barrier" and insert -- barrier --, therefor.

In Column 11, Line 22, delete "tretrafluoromethane" and insert -- tetrafluoromethane --, therefor.

In the Claims

In Column 18, Line 3, in Claim 15, after "method" insert -- of --.

In Column 18, Line 13, in Claim 19, after "method" insert -- of --.

Signed and Sealed this  
Ninth Day of May, 2017

Michelle K. Lee  
*Director of the United States Patent and Trademark Office*